United States Patent
Hirler et al.

(10) Patent No.: US 8,823,081 B2
(45) Date of Patent: Sep. 2, 2014

(54) TRANSISTOR DEVICE WITH FIELD ELECTRODE

(71) Applicant: Infineon Technologies Austria AG, Villach (AT)

(72) Inventors: Franz Hirler, Isen (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/624,040

(22) Filed: Sep. 21, 2012

(65) Prior Publication Data

US 2014/0084295 A1 Mar. 27, 2014

(51) Int. Cl.
*H01L 29/78* (2006.01)

(52) U.S. Cl.
USPC .......................................................... 257/328

(58) Field of Classification Search
CPC ........................... H01L 29/402; H01L 29/7803
USPC .......................................................... 257/328
See application file for complete search history.

(56) References Cited

U.S. PATENT DOCUMENTS

| | | | | |
|---|---|---|---|---|
| 6,525,372 B2 * | 2/2003 | Baliga | ............................. | 257/328 |
| 7,982,265 B2 * | 7/2011 | Challa et al. | .................... | 257/341 |
| 8,013,391 B2 * | 9/2011 | Yedinak et al. | ................ | 257/340 |
| 8,143,124 B2 * | 3/2012 | Challa et al. | .................... | 438/270 |
| 2007/0138544 A1 * | 6/2007 | Hirler et al. | ..................... | 257/330 |
| 2008/0017920 A1 * | 1/2008 | Sapp et al. | ...................... | 257/330 |
| 2011/0095362 A1 * | 4/2011 | Hirler et al. | ..................... | 257/334 |
| 2012/0220091 A1 * | 8/2012 | Challa et al. | ................... | 438/270 |
| 2013/0075808 A1 * | 3/2013 | Calafut et al. | ................. | 257/328 |
| 2013/0175605 A1 * | 7/2013 | Hirler et al. | ..................... | 257/328 |

\* cited by examiner

*Primary Examiner* — Matthew W Such
*Assistant Examiner* — Stephen C Smith
(74) *Attorney, Agent, or Firm* — Murphy, Bilak & Homiller, PLLC

(57) ABSTRACT

A transistor device includes a semiconductor body having a source region, a drift region, and a body region between the source region and the drift region. A source electrode is electrically coupled to the source region. A gate electrode adjacent the body region is dielectrically insulated from the body region by a gate dielectric. A field electrode adjacent the drift region is dielectrically insulated from the drift region by a field electrode dielectric and electrically coupled to one of the gate electrode and the source electrode. A rectifier element electrically couples the field electrode to the one of the gate electrode and the source electrode.

14 Claims, 6 Drawing Sheets

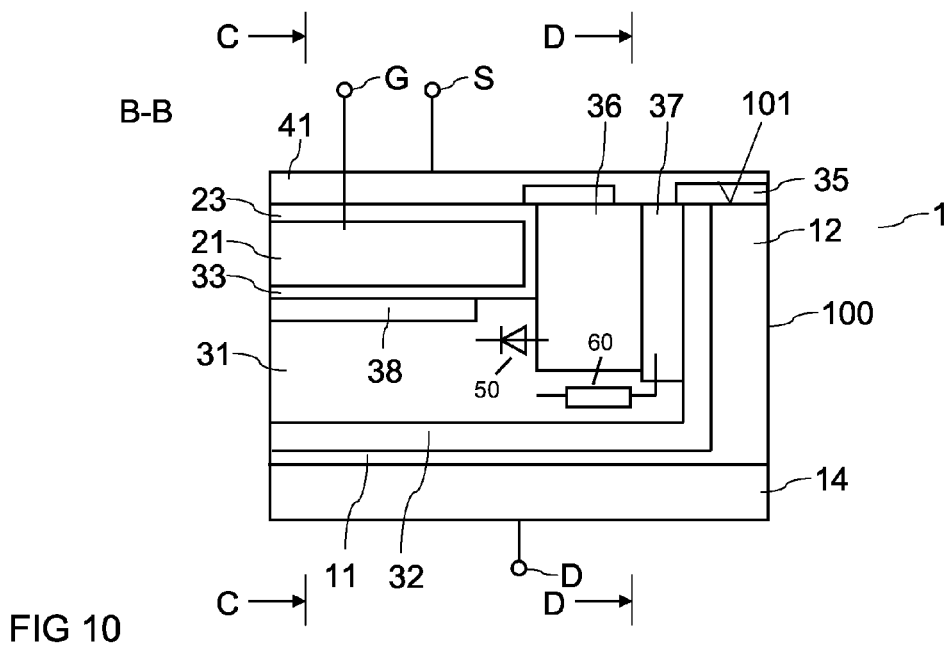
FIG 10
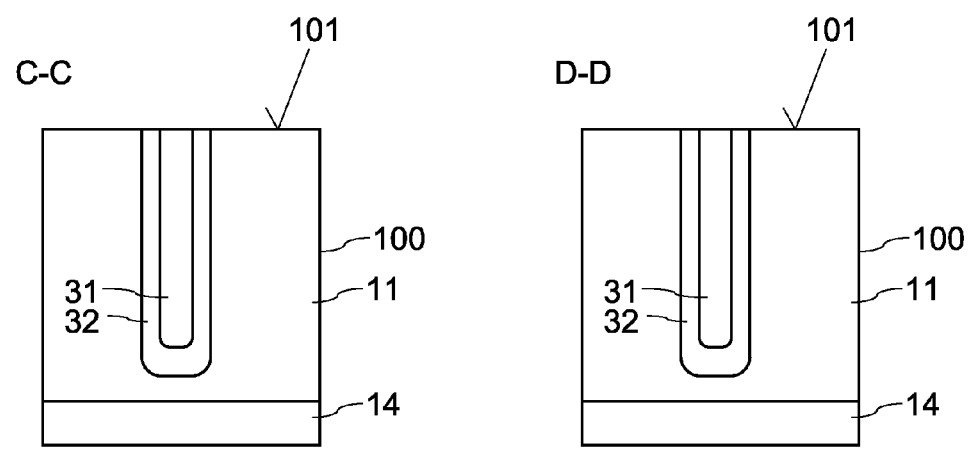
FIG 11A
FIG 11B
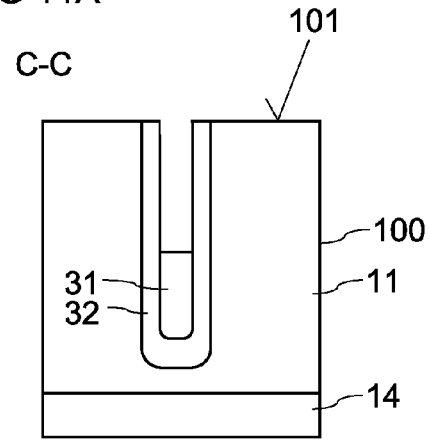
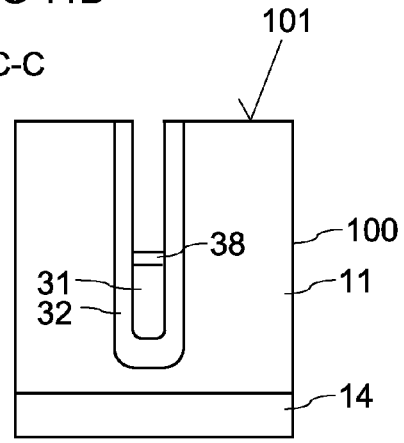
FIG 11C
FIG 11D

TRANSISTOR DEVICE WITH FIELD ELECTRODE

TECHNICAL FIELD

Embodiments of the present invention relate to a transistor device, in particular a transistor device with a field electrode.

BACKGROUND

Power transistor devices, such as power MOS transistors, include a drift region and a p-n junction between the drift region and a body region. The doping concentration of the drift region is lower than the doping concentration of the body region, so that a depletion region (space charge region) mainly expands in the drift region when the device blocks, which is when the p-n junction is reverse biased.

A length of the drift region in a current flow direction of the device and the doping concentration of the drift region mainly define the voltage blocking capability of the semiconductor device. In a unipolar device, such as a power MOSFET, the doping concentration of the drift region also defines the on-resistance of the device. The on-resistance is the electrical resistance of the semiconductor device in the on-state.

When the p-n junction is reverse biased dopant atoms are ionized on both sides of the p-n junction resulting in a space charge region that is associated with an electrical field. The integral of the magnitude of the field strength of the electrical field corresponds to the voltage that reverse biases the p-n junction, where the maximum of the electrical field is at the p-n junction. An avalanche breakthrough occurs when the maximum of the electrical field reaches a critical field strength that is dependent on the type of semiconductor material used to implement the drift region.

The doping concentration of the drift region may be increased without reducing the voltage blocking capability of the device when charges are provided in the drift region that may act as counter charges to ionized dopant atoms in the drift region when the p-n junction is reverse biased, which is when a depletion region expands in the drift region. Field electrodes or field plates may be provided in the drift region and dielectrically insulated from the drift region by a field electrode dielectric. These field electrodes may provide the required counter charges. These field electrodes may be electrically connected to a fixed electrical potential, such as gate or source potential in a MOS transistor.

The field electrode structure with the field electrode and the field electrode dielectric form a capacitive structure that, when the field electrode is connected to source potential, forms a part of the drain-source capacitance of the MOS transistor. The capacitive structure formed by the field electrode structure has a capacitance that is dependent on a load voltage between load terminals (drain and source terminals) of the transistor and decreases as the load voltage increases. In operation, the load voltage of the transistor increases when the transistor is switched from an on-state to an off-state. A reduced drain-source capacitance in the off-state reduces the capability of the transistor device to absorb voltage spikes. Those voltage spikes may, in particular, occur when the transistor switches from the on-state to the off-state and may result from parasitic devices and/or a load connected to the transistor device.

SUMMARY

A first embodiment relates to a transistor device. The transistor device comprises a semiconductor body. The semiconductor body includes a source region, a drift region, and a body region between the source region and the drift region. The transistor device further comprises a source electrode electrically coupled to the source region, a gate electrode adjacent the body region and dielectrically insulated from the body region by a gate dielectric, a field electrode adjacent the drift region, dielectrically insulated from the drift region by a field electrode dielectric, and electrically coupled to one of the gate electrode and the source electrode, and a rectifier element electrically coupling the field electrode to the one of the gate electrode and the source electrode.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 10 illustrates a further embodiment of the rectifier element integrated in a semiconductor body of the transistor device;

FIG. 11, which includes FIGS. 11A to 11F, illustrates a method for producing the field electrode of FIG. 10;

DETAILED DESCRIPTION

In the following Detailed Description, reference is made to the accompanying drawings, which form a part thereof, and in which is shown by way of illustration specific embodiments in which the invention may be practiced.

Figure 1:
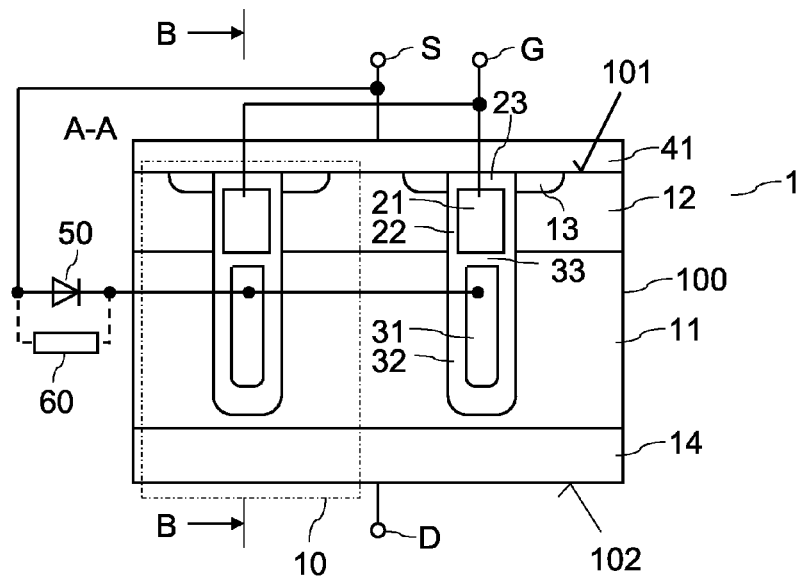
FIG. 1 illustrates a vertical cross sectional view of a transistor device with a field electrode and a rectifier element according to a first embodiment.

FIG. 1 illustrates a vertical cross-sectional view of a transistor device 1 according to a first embodiment. The transistor device 1 includes a semiconductor body 100 with a first surface 101, and, in the semiconductor body 100, a drift region 11, a source region 13 and a body region 12 between the source region 13 and the drift region 11. A gate electrode 21 is adjacent the body region 12 and dielectrically insulated from the body region 12 by a gate dielectric 22. The source region 13 and the body region 12 are electrically connected to a source electrode 41. The source electrode 41 forms a source terminal S or is electrically connected to the source terminal S of the transistor device 1.

Referring to FIG. 1, the transistor device 1 further includes a drain region 14 that is connected to a drain terminal D (only schematically illustrated in FIG. 1). The drift region 11 is arranged between the drain region 14 and the body region 12. As illustrated in FIG. 1, the drain region 14 may adjoin the drift region 11. According to a further embodiment, a field stop region (not illustrated) of the same doping type as the drift region 11, but more highly doped, is arranged between the drift region 11 and the drain region 14.

The transistor device 1 further includes a field electrode 31 adjacent the drift region 11 and dielectrically insulated from the drift region 11 by a field electrode dielectric 32. The field electrode 31 is electrically coupled to one of the source electrode 41 (as illustrated in FIG. 1) and the gate electrode 21 (not illustrated). A rectifier element 50, such as a diode, is connected between the one of the source electrode 41 and the gate electrode 21 and electrically couples the field electrode 31 to the one of the source electrode 41 and the gate electrode 21. Optionally, a resistive element 60 is additionally connected between the one of the source electrode 41 and the gate electrode 21 and the field electrode 31. In FIG. 1, the rectifier element 50 and the resistive element 60 are only schematically illustrated using circuit symbols. Embodiments for implementing the rectifier element 50 and the resistive element 60 are explained below.

The transistor device 1 may include a plurality of identical device structures, known as transistor cells. Each transistor cell includes a source region 13, a body region 12, a gate electrode 21 adjacent the body region 12, a drift region 11, a drain region 14, and a field electrode 31 adjacent the drift region 11. In the embodiment of FIG. 1, two transistor cells (four transistor half-cells) 10 are illustrated, where the individual transistor cells 10 share the drift region 11 and the drain region 14. Two transistor half-cells share the gate electrode 21 and the field electrode 31. The individual transistor cells 10 are connected in parallel by having the source regions 13 and the body regions 12 electrically connected to the source electrode 41, and by having the individual gate electrodes 21 electrically connected to a gate terminal G. The connection between the gate electrodes 21 and the gate terminal G is only schematically illustrated in FIG. 1. This connection can be implemented in a conventional way.

The transistor device 1 of FIG. 1 is implemented as a vertical transistor device. That is, the source region 13 and the drain region 14 are distant in a vertical direction of the semiconductor body 100. The vertical direction of the semiconductor body 100 is a direction perpendicular to the first surface 101. In the transistor device 1 of FIG. 1, the source regions 13 are located in a region of the first surface 101 of the semiconductor 100, while the drain region 14 is located in a region of a second surface 102 opposite the first surface 101.

The transistor device of FIG. 1 is implemented with trench gate electrodes 21. That is, the gate electrodes 21 are arranged in trenches that extend from the first surface 101 into the semiconductor body 100 and extend through the source region 13 and the body region 12 to or into the drift region 11. In the present embodiment, the field electrodes 31 are arranged in the same trenches as the gate electrodes 21 and below the gate electrodes 21. In the trenches, the field electrodes 31 and the gate electrodes 21 are dielectrically insulated by a dielectric layer 33.

Implementing the transistor device 1 as a vertical transistor device with trench gate electrodes 21 and with field electrodes 31 in the same trenches as the gate electrodes 21 is only an example. The operating principle explained below also applies to a lateral transistor device, which is a transistor device in which the source region and the drain region are distant in a lateral (horizontal) direction of the semiconductor body. In this case the field plates may be arranged in trenches but may also be arranged on the surface. It also applies to a vertical transistor with planar gate electrodes, or to a vertical transistor device with gate electrodes and field electrodes in separate trenches, to mention only some possible modifications.

The transistor device 1 can be implemented as an n-type transistor device or as a p-type transistor device. In an n-type transistor device, the source region 13 and the drift region 11 are n-doped, while the body region 12 is p-doped. In a p-type transistor device, the source region 13 and the drift region 11 are p-doped, while the body region 12 is n-doped. The transistor device 1 can be implemented as an enhancement (normally-off) transistor device or as a depletion (normally-on) transistor device. In a normally-off device, the body region 12 adjoins the gate dielectric 22. In a normally-on device, a channel region of the same doping type as the source region 13 and the drift region 11 extends between the gate dielectric 22 and the body region 12 from the source region 13 to the drift region 11. Further, the transistor device 1 can be implemented as a MOSFET (Metal Oxide Semiconductor Field-Effect Transistor) or as an IGBT (Insulated Gate Bipolar Transistor). In a MOSFET, the drain region 14 has the same doping type as the drift region 11, while in an IGBT the drain region 14 has a doping type complementary to the doping type of the drift region 11.

The doping concentration of the drift region 11 is, for example, between $1E11$ $cm^{-3}$ and $1E17$ $cm^{-3}$, the doping concentration of the source and drain regions 13, 14 is, for example, between $1E18$ and $1E21$ $cm^{-3}$, and the doping concentration of the body region 12 is, for example, between $1E15$ and $1E18$ $cm^{-3}$.

Figure 2:
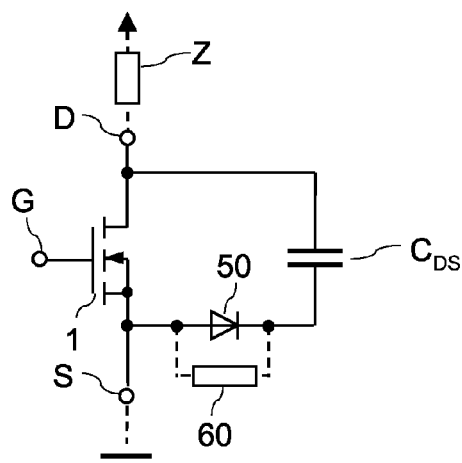
FIG. 2 illustrates a use of the transistor device as a switch for switching a load.

The operating principle of the transistor device 1 of FIG. 1 is explained below with reference to FIGS. 1 and 2. For explanation purposes it is assumed that the transistor device 1 is an n-type enhancement MOSFET. The circuit symbol of this n-type enhancement MOSFET is illustrated in FIG. 2. Referring to FIG. 2, it is further assumed that the transistor device 1 is used as an electronic switch for switching an electrical load Z connected in series with a load path (drain-source path) D-S of the transistor device 1. In operation, the series circuit with the transistor device 1 and the load Z is connected between terminals for a positive supply potential V+ and a negative supply potential or reference potential GND, respectively.

The transistor device 1 can be switched on and switched off like a conventional transistor device by applying a suitable drive signal (drive potential) to the gate terminal G. The transistor device (MOSFET) 1 of FIGS. 1 and 2 is a voltage controlled device that switches on and off dependent on a drive voltage (gate-source voltage) $V_{GS}$ applied between the gate and the source terminals G, S. An n-type MOSFET switches on when the drive voltage $V_{GS}$ is above a threshold voltage, and switches off when the drive voltage $V_{GS}$ is below the threshold voltage. In an n-type enhancement MOSFET, the threshold voltage is a positive voltage. When the transistor device 1 is switched on, a load path voltage (drain-source voltage) $V_{DS}$ of the transistor device 1 is relatively low, while most of the supply voltage available between the supply terminals drops across the load Z. When, however, the transistor device 1 is switched off and blocks, the supply voltage drops across the drain-source path D-S of the transistor device 1.

Referring to FIG. 1, when the transistor device 1 is switched on by applying a suitable drive potential through a gate electrode 21, there is a conducting channel in the body region 12 along the gate dielectric 22 between the source region 13 and the drift region 11, so that a current may flow between the drain and the source terminals D-S when a voltage is applied between these terminals D, S. When a voltage is applied between the drain and source terminals D, S that reverse biases a p-n junction between the body region 12 and the drift region 11 and when the transistor device 1 is switched off, a depletion region (space charge region) expands in the drift region 11 beginning at the p-n junction between the drift region 11 and the body region 12. The width of the depletion region, which is a dimension of the depletion region in a direction perpendicular to the p-n junction, is dependent on the voltage that reverse biases the p-n junction, where the width of the depletion region increases as the reverse biasing voltage increases. Within the depletion region there are ionized dopant atoms in the drift region 11. These ionized dopant atoms have a positive charge when the drift region 11 is n-doped (and have a negative charge when the drift region 11 is p-doped). Negative charges corresponding to the positive charges in the drift region 11 are located in the body region 12. Due to the fact that the field electrode 31 is electrically coupled to the source terminal S (or the gate terminal G), and due to the fact that the electrical potential at the source terminal S (or at the gate terminal G) is lower than the electrical potential in the drift region 11 when the depletion region expands, negative charges are also provided by the field electrode 31. Thus, each ionized dopant atom in the drift region 11 has a corresponding counter charge in the body region 12 of the field electrode 31.

The voltage blocking capability of the semiconductor device 1 is reached, when the electrical field, generated by ionized dopant atoms in the drift region 11 and corresponding counter charges in the body region 12, reaches the critical electrical field. The critical electrical field is a material property of the semiconductor material of the semiconductor body 100 which slightly depends on the carrier mean free path length. The semiconductor material of the semiconductor body 100 is, e.g., silicon or another conventional semiconductor material. The reverse biasing voltage at which the critical electrical field is reached at the p-n junction is dependent on the doping concentration of the drift region 11 and is, therefore, dependent on the number of dopant atoms that can be ionized when a reverse biasing voltage is applied between the drain and source terminals D, S. However, when ionized dopant atoms in the drift region 11 find corresponding counter charges, not only in the body region 12 on the other side of the p-n junction, but also within the drift region 11, namely in the field electrode 31, the doping concentration of the drift region 11 can be increased without decreasing the voltage blocking capability of the semiconductor device. Increasing the doping concentration of the drift region 11 is beneficial, concerning the on-resistance of the semiconductor device. In a unipolar semiconductor device, such as a MOSFET, the on-resistance is mainly defined by the ohmic resistance of the drift region 11, where the ohmic resistance decreases when the doping concentration of the drift region 11 increases.

In a conventional transistor device with a field electrode, the field electrode is charged when the transistor device switches off and a depletion region expands in the drift region, and the field electrode is discharged when the transistor device switches on and the depletion is removed from the drift region 11. Referring to FIG. 1, the field electrode structure with the field electrode 31 and the field electrode dielectric 32 forms a capacitive structure connected between the source terminal S and the drain terminal D. This capacitive structure contributes to the drain-source capacitance of the transistor device 1. This drain-source capacitance $C_{DS}$ is represented by a capacitor (labeled $C_{DS}$) in the circuit diagram of FIG. 2. The capacitance of the capacitive structure formed by the field electrode structure is dependent on the reverse biasing voltage $V_{DS}$ and decreases as the reverse biasing voltage $V_{DS}$ increases. When the transistor device 1 switches from the on-state to the off-state, voltage spikes induced by the load Z and/or parasitic devices (not illustrated in FIG. 2) may occur between the drain and source terminals D, S of the transistor device 1. Such voltage spikes can be absorbed (dampened) by the capacitive structure $C_{DS}$, so as to prevent these voltage spikes from increasing the voltage between the drain and source terminals D, S to above the voltage blocking capability. However, the capability of the capacitive structure $C_{DS}$ to absorb such voltage spikes reduces as the load voltage $V_{DS}$ increases, the field electrode 31 is more and more charged, and the capacitance of the capacitive structure $C_{DS}$ decreases.

In the transistor device 1 of FIG. 1, charging of the field electrode 31 when the transistor device 1 switches off, is delayed by virtue of the resistive element 60 connected between the source terminal S and the field electrode 31. This helps to prevent the capacitance of the capacitive structure $C_{DS}$ from decreasing rapidly, and, therefore, helps to absorb voltage spikes during the transition from the on-state to the off-state. Further, the capacitive structure $C_{DS}$ and parasitic inductances (not shown in FIG. 1) such as inductances of internal connection lines in the transistor device 1 and/or of external connection lines between the transistor device 1 and the load Z and the supply terminals, respectively, form a resonant circuit. This resonant circuit is excited each time the transistor device switches from the on-state to the off-state, causing voltage oscillations across the capacitive structure $C_{DS}$ and between the load terminals D, S. The resistive element 60 helps to reduce voltage spikes of those oscillations and attenuates those oscillations, so as to reduce negative effects of those oscillations on the switching behavior of the transistor device.

The overall resistance of the resistive element 60 is, e.g., between 1Ω (Ohm) and 10Ω (Ohm). The resistive element 60 may be implemented as a discrete resistor or may be implemented as a distributed resistor.

While it is desirable to delay charging the field electrode 31 when the transistor device 1 switches from the on-state to the off-state (and to attenuate oscillations in the parasitic resonant circuit), it is not desirable to delay discharging the field electrode 31 when the transistor device 1 switches from the off-state to the on-state. If discharging of the field electrode 31 were delayed, the transistor device 1 would have an increased on-resistance between the time when the transistor device 1 switches on and the time when the field electrode 31 has been discharged. In order to prevent that the resistive element 60 delays the discharging process of the field electrode 31 and in order to keep losses low in the resistive element 60, the rectifier element 50 is connected between one of the source terminal S and the gate terminal G and the field electrode 31.

In the embodiment of FIG. 1, the rectifier element 50 and the resistive element 60 are connected between the same one of the source terminal S and the gate terminal G and the field electrode 31. According to a further embodiment (not illustrated) one of the rectifier element 50 and a resistive element 60 is connected between one of the source terminal S and the gate terminal G and the field electrode 31, and the other one of the rectifier element 50 and the resistive element 60 is connected between the other one of the source terminal S and the gate terminal G and the field electrode 31.

The operating principle of the rectifier element 50 and the resistive element 60 is as follows. When the transistor device 1 is switched off and the electrical potential in the drift region 11 surrounding the field electrode structure increases, the electrical potential of the field electrode 31, at first, also increases to above the electrical potential of the source terminal S, such as, e.g., to between 5V and 10V above the electrical potential of the source terminal S, until the field electrode 31 has been charged via the resistive element 60. When the transistor device 1 is switched on and the electrical potential in the drift region 11 decreases, the field electrode 31 that is capacitively coupled with the drift region 11 by virtue of the rectifier element 50, is kept at an electrical potential that corresponds to the source potential minus the forward voltage of the diode 50. The forward voltage of the diode 50 is, e.g., about 1V. Thus, when the electrical potential of the drift region 11 decreases, the electrical potential of the field electrode 31 cannot drop below the source potential minus the forward voltage of the diode 50, so that the field electrode 31 is approximately kept at the source potential.

The rectifier element 50 and the resistive element 60 can be implemented in many different ways. Some embodiments are explained below.

Figure 3:
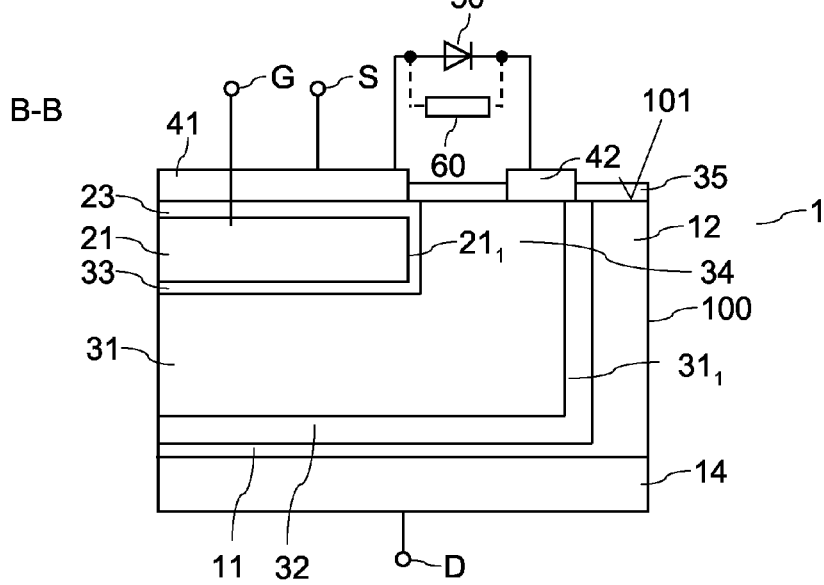
FIG. 3 illustrates a vertical cross sectional view of the field electrode according to a first embodiment.

FIG. 3 illustrates a vertical cross-sectional view of a transistor device 1 in which the field electrode 31 is arranged below the gate electrode 21 in the same trench and in which the field electrode 31 and the gate electrode 21 are elongated electrodes. The cross-section illustrated in FIG. 3 is a cross-section in a section plane B-B that is perpendicular to the section plane A-A of FIG. 1. FIG. 3 shows a cross-section through the gate electrode 21 and the field electrode 31, wherein in FIG. 3 mainly those sections of the gate electrode 21 and the field electrode 31 in the region of longitudinal ends of the elongated gate electrode 21 and the elongated field electrode 31 are shown. In FIG. 3, reference number $21_1$ denotes a longitudinal end of the gate electrode 21, while reference character $31_1$ denotes a longitudinal end of the field electrode 31. Referring to FIG. 3, the field electrode 31 has an end section 34 in the region of the longitudinal end $31_1$. This end section 34 extends to the first surface 101 of the semiconductor body 100 and is dielectrically insulated from the gate electrode 21, in particular from the longitudinal end $21_1$ and the gate electrode 21, and from regions of the semiconductor body 100 surrounding the field electrode 31. The end section 34 of the field electrode 31 is electrically connected to a connection electrode 42 at the first surface 101. The connection electrode 42 is distant to the source electrode 41 in a lateral (horizontal) direction of the semiconductor body 100. The rectifier element 50 and the resistive element 60 are connected between the source electrode 41 and the connection electrode 42. In FIG. 3, the rectifier element 50 and the resistive element 60 are only schematically illustrated using circuit symbols.

Figure 4:
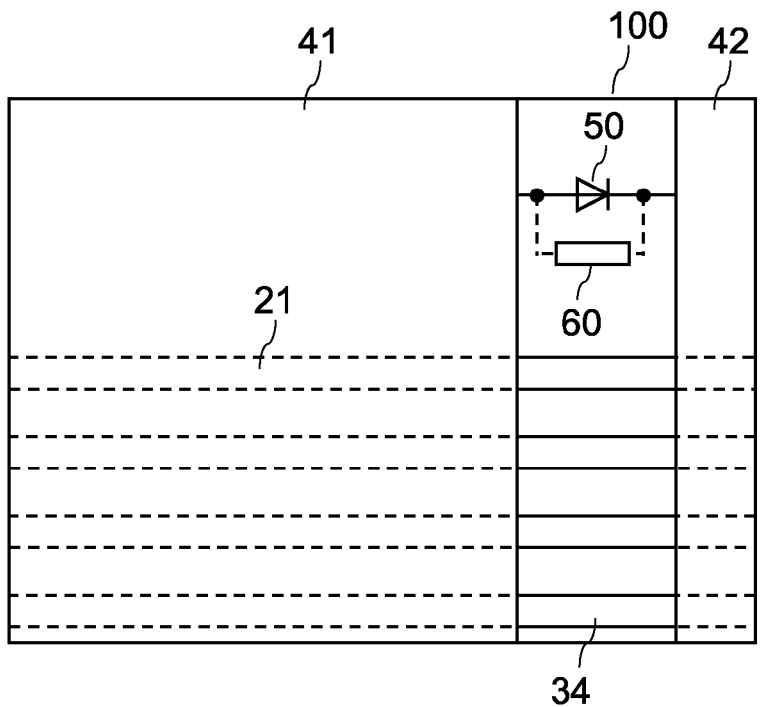
FIG. 4 illustrates a top view of the semiconductor device.

FIG. 4 illustrates a top view of the transistor device 1 of FIG. 3, according to one embodiment. In the transistor device 1 of FIG. 4, there is a plurality of trenches that are essentially perpendicular. In each of these trenches a gate electrode 21 and a field electrode 31 are arranged, as explained with reference to FIG. 3. In FIG. 4, the trenches below the source electrode 41 and the connection electrode 42 are illustrated in dashed lines. The end sections 34 of the individual field electrodes 31 extend to the first surface of the semiconductor body 100 between the source electrode 41 and the connection electrode 42. An optional passivation layer (35 in FIG. 3) on the first surface 101 of the semiconductor body 100 is not illustrated in FIG. 4. The source electrode 41 is connected to the source regions of the individual transistor cells (the source regions are not illustrated in FIG. 4) and the connection electrode 42 is electrically connected to the individual field electrodes 31 via the end sections 34.

Referring to FIG. 4, the rectifier element 50 and the resistive element 60 are connected between the source electrode 41 and the connection electrode 42 in a region of the semiconductor body 100 that is distant to the trenches with the gate electrodes 21 and the field electrodes 31.

Figure 5:
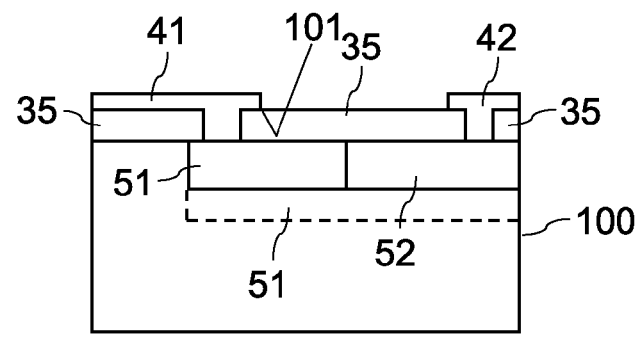
FIG. 5 illustrates a first embodiment of the rectifier element integrated in a semiconductor body of the transistor device.

FIG. 5 illustrates a vertical cross-sectional view of the semiconductor body 100 in a region in which the rectifier element 50 is integrated. Referring to FIG. 5, the rectifier element 50 includes two doped semiconductor regions 51, 52 that form a p-n junction. One of these semiconductor regions 51 is electrically connected to the source electrode 41, and the other one of these semiconductor regions 52 is electrically connected to the connection electrode 42. The first and second semiconductor regions 51, 52 form a diode. In an n-type transistor device 1, this diode has an anode region connected to the source electrode 41, while a cathode region is connected to the connection electrode 42. Consequently, in an n-type transistor device 1, the first semiconductor region (anode region) 51 is p-doped, while the second semiconductor region (cathode region) 52 is n-doped. According to one embodiment (illustrated in dashed lines in FIG. 5) the anode region 51 surrounds the cathode region 52 in the semiconductor body 100. In the embodiment of FIG. 5, the anode region 51 and the cathode region 52 of the diode may be implemented as monocrystalline semiconductor regions.

Figure 6:
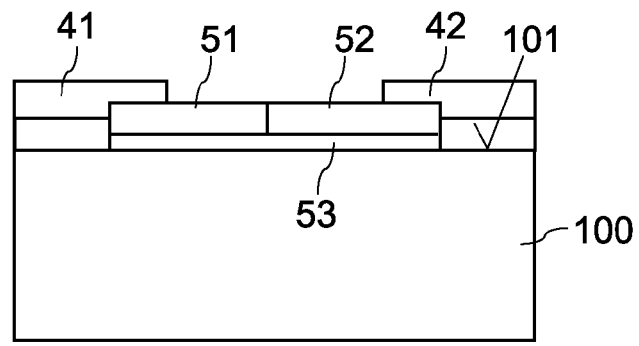
FIG. 6 illustrates a second embodiment of the rectifier element.

FIG. 6 illustrates a vertical cross-sectional view of the semiconductor body 100 in a region in which a rectifier element 50 according to a further embodiment is integrated. In this embodiment, the anode region 51 and the cathode region 52 are arranged above the first surface 101 and are dielectrically insulated from the semiconductor body 100 by a dielectric layer 53 such as an oxide layer. Like in the embodiment of FIG. 5, the anode region 51 is electrically connected to the source electrode 41, and the cathode region 52 is electrically connected to the connection electrode 42. The anode region 51 and the cathode region 52 form a pn junction and may include a polycrystalline semiconductor material in this embodiment.

Figure 7:
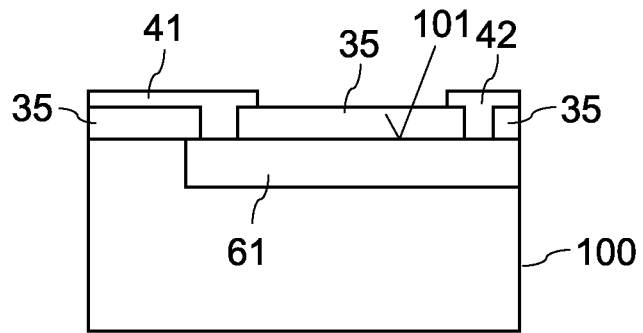
FIG. 7 illustrates a first embodiment of a resistive element integrated in the semiconductor body of the transistor device.

FIG. 7 schematically illustrates a vertical cross-sectional view of the semiconductor body 100 in a region in which the resistive element 60 is integrated. In this embodiment, the resistive element 60 includes a doped semiconductor region 61 that is electrically connected to the source electrode 41 and the connection electrode 42. An electrical resistance of the resistive element 60 is defined by the doping concentration of the semiconductor region 61.

Figure 8:
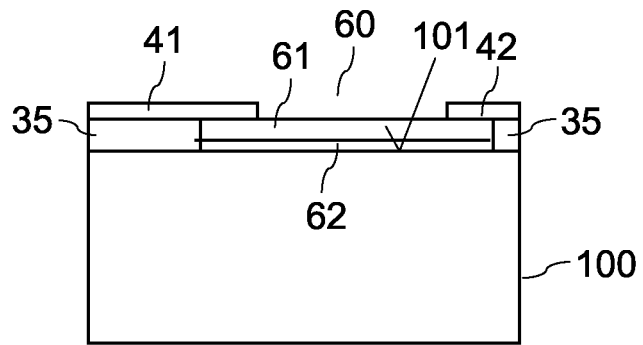
FIG. 8 illustrates a second embodiment of a resistive element.

FIG. 8 schematically illustrates a vertical cross-sectional view of the semiconductor body 100 in a region in which a resistive element 60 according to a further embodiment is integrated. In this embodiment, the resistive element 60 includes a resistive material layer 61 above the first surface 101 of the semiconductor body 100 and dielectrically insulated from the semiconductor body 100 by a dielectric layer 62 such as an oxide layer. Like in the embodiment of FIG. 7, the resistive element 61 is electrically connected to the source electrode 41 and electrically connected to the connection electrode 42 at a position distant to the source electrode 41. The resistive layer 61 of the resistive element 60 may include a polycrystalline semiconductor material. A doping concentration of the resistive layer 61 and a distance between the positions where the source electrode 41 and the connection electrode 42 contact the resistive layer 61 defines the resistance of the resistive element 60. According to one embodiment (not illustrated), the resistive element 60 includes several of the structures as illustrated in FIGS. 7 and 8, with the individual structures connected in parallel. The overall resistance of the resistive element 60 between the source electrode 41 and the connection electrode 42 is, e.g., between 1Ω (Ohm) and 10Ω (Ohm).

Figure 9:
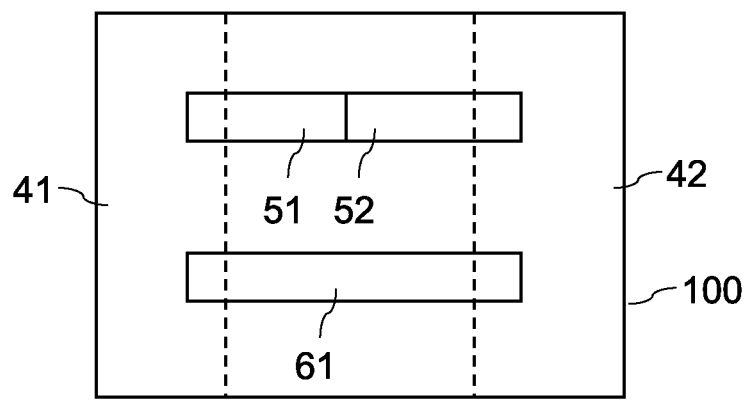
FIG. 9 illustrates a top view on the rectifier element and the resistive element of FIG. 5 or 6, and FIG. 7 or 8, respectively.

FIG. 9 illustrates a top view on a region of the semiconductor body 100, in which the rectifier element 50 and the resistive element 60 are implemented. The anode and cathode regions 51, 52, forming the rectifier element 50, are distant from the resistive layer 61, forming the resistive element 60. The anode and the cathode region 51, 52 may be integrated in the semiconductor body 100, as explained with reference to FIG. 5, or may be arranged above the first surface of the semiconductor body 100, as explained with reference to FIG. 6. Further, the resistive layer 61 may be integrated in the semiconductor body 100, as explained with reference to FIG. 7, or may be arranged above the first surface of the semiconductor body 100, as explained with reference to FIG. 8.

FIG. 10 illustrates a further embodiment for implementing the rectifier element 50 and the resistive element 60. In this embodiment, the rectifier element 50 and the resistive element 60 are both formed in the trench in which the field electrode 32 is arranged. The embodiment of FIG. 10 is based on the embodiment of FIG. 3, wherein the embodiment of FIG. 10 is different from the embodiment of FIG. 3 in that in the end section of the field electrode 31, the rectifier element 50 is formed. The circuit symbol of the rectifier element 50 is illustrated in FIG. 10. In the embodiment of FIG. 10, the field electrode 31 includes a doped semiconductor material of a first doping type. A rectifier element region 36 of a complementary doping type adjoins the field electrode 31. The rectifier element region 36 extends to the first surface 101 of the semiconductor body 100 and is electrically connected to the source electrode 41 in the region of the first surface 101. The field electrode 31 and the rectifier element region 36 form a p-n junction, wherein this p-n junction forms a rectifier element 50. In an n-type transistor device 1, the field electrode 31 includes an n-doped semiconductor material, while the rectifier element region 36 includes a p-doped semiconductor material. The semiconductor material of the field electrode 31 and the rectifier element region 36 may be a monocrystalline semiconductor material or a polycrystalline semiconductor material.

Optionally, the field electrode 32 includes a highly conductive material layer 38 along the dielectric layer 33 that dielectrically insulates the field electrode 31 from the gate electrode 21. The highly conductive layer 38 is, for example, a metal layer or a silicide layer. This highly conductive layer 38, that may be spaced apart from the rectifier element region 36, helps to equally distribute the electrical potential all over the field electrode 31.

Referring to FIG. 10, the field electrode 31 is further connected to the source electrode 41 via a section of the field electrode 31 between the rectifier element region 36 and the field electrode dielectric 32. Optionally, the field electrode 31 includes a connection region 37 that has the same doping type as the field electrode 31 and is more highly doped. This connection region 37 may extend from the first surface 101 to below the rectifier element region 36. In this case, the doping concentration and the dimension of the field electrode section below the rectifier element region 36 and the connection region 37 mainly defines the resistance of the resistive element 60 connecting the field electrode 31 to the source electrode 41.

An embodiment of a method for producing a transistor device 1 of FIG. 10 is explained with reference to FIGS. 11A to 11F. These figures show a vertical cross-sectional view of the semiconductor body 100 in a section plane C-C or D-D of FIG. 10. In a region of the first section plane C-C a field electrode 31 and a gate electrode 21 are produced, while in the region of the second section plane D-D the end section of the field electrode 31 with the rectifier element region 36 is produced.

FIGS. 11A and 11B show vertical cross-sectional views of the semiconductor body 100 in the first and second region after first method steps. In these method steps the trenches are formed, the field electrode dielectric 32 is formed on the bottom, the sidewalls of the trench and, optionally, on the surface 101, and the trench is filled with the field electrode material 31. The field electrode material is, e.g. a lightly n-doped polysilicon. The method steps explained in the following are only performed in the first region, while the second region is covered by a suitable protection layer during these method steps, or materials deposited everywhere on the semiconductor body 100 are removed in the second region.

Referring to FIG. 11C, the field electrode 31 is etched back. Then, referring to FIG. 11D, the highly conductive layer 38 is formed on top of the field electrode 31. According to one embodiment, the highly conductive layer 38 is a silicide layer. In this case, the field electrode 31 may include a polycrystalline silicon, and forming the highly conductive layer 38 may include depositing a metal layer and performing a temperature process in which a silicide forms from the metal and the polycrystalline silicon only on the field electrode 31.

Figure 11E:
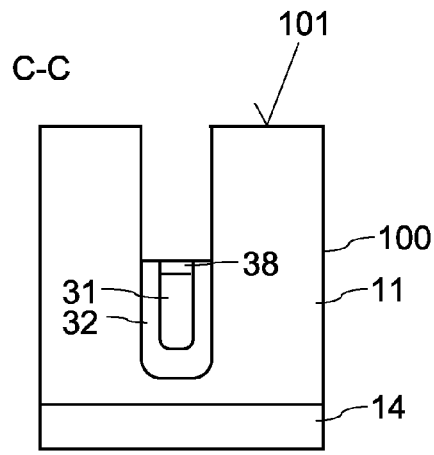

Referring to FIG. 11E the field electrode dielectric 32 is removed from the side walls of the trench above the field electrode 32. In case the field electrode dielectric 32 has also been formed on the first surface 101, the field electrode dielectric 32 is removed from the first surface 101 in this method step.

Figure 11F:
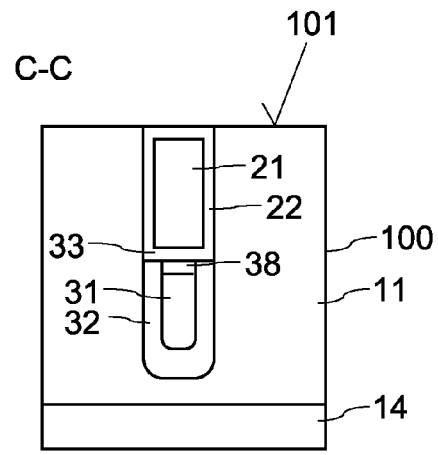

Finally, referring to FIG. 11F, the gate dielectric 22 and the gate electrode 21 as well as the insulation layer 33 are formed in a trench above the field electrode 32 and the surface 101 is exposed.

The rectifier element region 36 (see FIG. 10) and the connection region 37 (see FIG. 10) may be formed by suitably doping the end section of the field electrode 31 after removing the protection layer in the second region.

Figure 12:
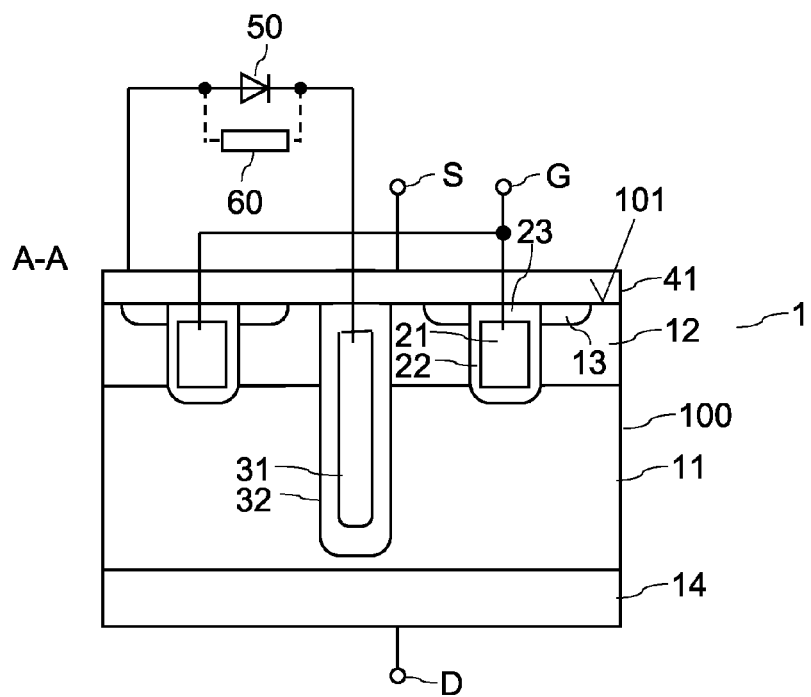
FIG. 12 illustrates a vertical cross sectional view of a transistor device with a field electrode and a rectifier element according to a further embodiment.

FIG. 12 illustrates a vertical cross-sectional view of a modification of the transistor device of FIG. 1. In the transistor device of FIG. 12, the field electrode 32 and the gate electrodes 21 are in separate trenches that are distant in the lateral (horizontal) direction of the semiconductor body 100.

Figure 13:
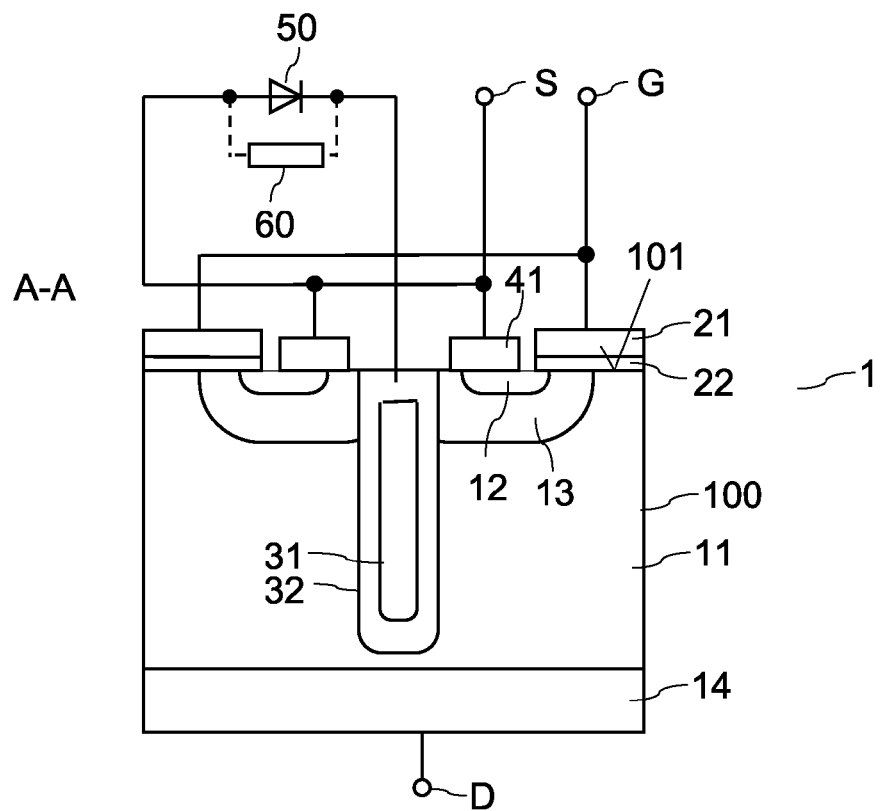
FIG. 13 illustrates a vertical cross sectional view of a transistor device with a field electrode and a rectifier element according to a further embodiment.

FIG. 13 illustrates a further modification. While in the transistor device 1 of FIG. 10, the gate electrodes 21 are trench electrodes, the gate electrodes of the transistor device of FIG. 13 are planar or gate electrodes arranged above the first surface 101 of the semiconductor body 100.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
    a semiconductor body including a source region, a drift region, and a body region between the source region and the drift region;
    a source electrode electrically coupled to the source region;
    a gate electrode adjacent the body region and dielectrically insulated from the body region by a gate dielectric
    a field electrode adjacent the drift region, dielectrically insulated from the drift region by a field electrode dielectric, and electrically coupled to the source electrode;
    a drain region spaced apart from the field electrode by the drift region; and
    a rectifier element electrically coupling the field electrode to the source electrode;
    wherein the rectifier element comprises a first region and a second region, and one of the first region and second region is connected to the source electrode, and the other of the first region and second region is only connected to the field electrode.

2. The transistor device of claim 1, wherein the source region is n-doped, the rectifier element includes an anode region and a cathode region, and the anode region is connected to the one of the gate electrode and the source electrode.

3. The transistor device of claim 1, wherein the source region is p-doped, the rectifier element includes an anode region and a cathode region, and the cathode region is connected to the one of the gate electrode and the source electrode.

4. The transistor device of claim 1, further comprising a resistive element coupling the field electrode to the one of the gate electrode and the source electrode.

5. The transistor device of claim 4, wherein the resistive element is connected in parallel to the rectifier element.

6. The transistor device of claim 1, further comprising a connection electrode electrically connected to the field electrode, wherein the rectifier element is connected between the source electrode and the connection electrode.

7. The transistor device of claim 6, wherein the semiconductor body has a first surface, the source electrode and the connection electrode are arranged above the first surface and distant to each other, and the rectifier element is integrated in the semiconductor body below the first surface.

8. The transistor device of claim 7, wherein the rectifier element comprises two doped semiconductor regions forming a p-n junction.

9. The transistor device of claim 8, wherein the two doped semiconductor regions are monocrystalline semiconductor regions.

10. The transistor device of claim 8, wherein the two doped semiconductor regions are polycrystalline semiconductor regions.

11. The semiconductor device of claim 1, wherein the field electrode comprises a polycrystalline semiconductor material of a first doping type, and wherein the semiconductor device further comprises a polycrystalline rectifier element region of a second doping type complementary to the first doping type, the rectifier element region adjoining the field electrode and connected to the one of the gate electrode and the source electrode.

12. The semiconductor device of claim 11, wherein the field electrode is arranged in a trench of the semiconductor body.

13. The semiconductor device of claim 12, wherein the rectifier element region is arranged in the trench.

14. The semiconductor device of claim 12, wherein the gate electrode is arranged in the trench between the field electrode and the first surface of the semiconductor body.

* * * * *